(12) United States Patent
Sun

(10) Patent No.: US 12,250,485 B2
(45) Date of Patent: Mar. 11, 2025

(54) LOW POWER CURRENT INTEGRATION DAC RAMP SETTLING ASSIST CIRCUIT

(71) Applicant: OMNIVISION TECHNOLOGIES, INC., Santa Clara, CA (US)

(72) Inventor: Tao Sun, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 318 days.

(21) Appl. No.: 17/659,041

(22) Filed: Apr. 13, 2022

(65) Prior Publication Data

US 2023/0336165 A1    Oct. 19, 2023

(51) Int. Cl.
| | |
|---|---|
| *H04N 25/78* | (2023.01) |
| *H03K 4/501* | (2006.01) |
| *H03K 4/56* | (2006.01) |
| *H04N 25/75* | (2023.01) |

(52) U.S. Cl.
CPC ............ *H04N 25/78* (2023.01); *H03K 4/501* (2013.01); *H03K 4/56* (2013.01); *H04N 25/75* (2023.01)

(58) Field of Classification Search
None
See application file for complete search history.

(56) References Cited

U.S. PATENT DOCUMENTS

| | | | |
|---|---|---|---|
| 9,571,775 B1 | 2/2017 | Zuo et al. | |
| 10,356,351 B1 * | 7/2019 | Ebihara | H01L 27/14609 |
| 10,498,993 B1 | 12/2019 | Ebihara et al. | |
| 10,826,470 B2 | 11/2020 | Zuo et al. | |
| 11,770,634 B1 * | 9/2023 | Tian | H03K 4/50 348/300 |
| 2016/0205333 A1 | 7/2016 | Shishido et al. | |
| 2017/0237914 A1 | 8/2017 | Cho et al. | |
| 2018/0167573 A1 | 6/2018 | Zhu et al. | |
| 2020/0295739 A1 * | 9/2020 | Zuo | H03K 4/502 |
| 2021/0084245 A1 | 3/2021 | Kim et al. | |
| 2022/0060647 A1 | 2/2022 | Lee et al. | |

OTHER PUBLICATIONS

U.S. Appl. No. 17/217,950, filed Mar. 30, 2021 (37 pages).

* cited by examiner

*Primary Examiner* — Quan Pham
(74) *Attorney, Agent, or Firm* — Perkins Coie LLP

(57) ABSTRACT

A ramp generator includes an operational amplifier having an output to generate a ramp signal. An integration current source is coupled to a first input and a reference voltage is coupled to a second input of the operational amplifier. A feedback capacitor and a reset switch are coupled between the first input and the output of the operational amplifier. The reset switch is turned on to reset the ramp generator. A ramp event is configured to be generated in the ramp signal at the output of the operational amplifier in response to the reset switch being turned off. An assist current source is coupled between the output of the operational amplifier and ground. The assist current source is configured to conduct an assist current from the output of the operational amplifier to ground in response to the reset switch being turned off.

20 Claims, 5 Drawing Sheets

LOW POWER CURRENT INTEGRATION DAC RAMP SETTLING ASSIST CIRCUIT

BACKGROUND INFORMATION

Field of the Disclosure

This disclosure relates generally to image sensors, and in particular but not exclusively, relates to a ramp generator in an image sensor.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

Analog to digital converters (ADCs) are often used in CMOS image sensors (CIS) to convert the charge into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge.

It is appreciated that the ramp settling time, or delay, of the ramp signal that is generated by the ramp generator and received by the comparator can limit the maximum frame rate of the image sensor. Thus, reducing the ramp settling time of the ramp signal that is received by the comparator can increase the maximum frame rate and therefore the performance of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
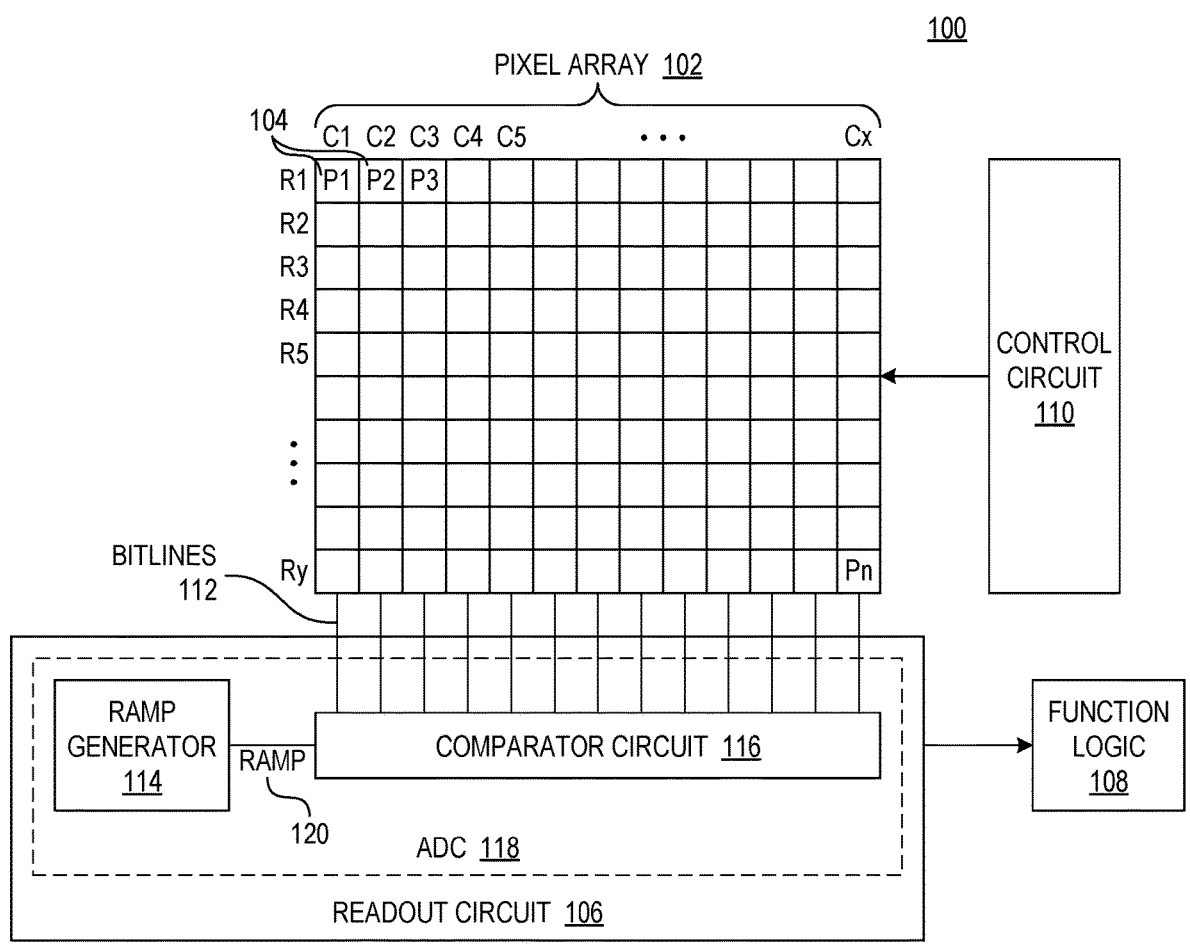
FIG. 1 illustrates one example of an imaging system including a readout circuit with a ramp generator with a ramp settling assist circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system including a readout circuit with a current integration ramp generator with a low power ramp settling assist circuit are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a readout circuit with a current integration ramp generator with a low power ramp settling assist circuit are described. In various examples, the ramp generator is a current integration ramp generator including an operational amplifier configured as an integrator with feedback capacitor coupled between an input and an output of the operational amplifier. An integration current source is also coupled to the input of the operational amplifier. In the examples, a low power ramp settling assist circuit includes an assist current source that is coupled between the output of the current integration ramp generator and ground. In the examples, the low power ramp settling assist circuit provides an assist current from the output of the ramp generator to ground that is switched on during a ramp event or a ramp phase of the output ramp signal of the ramp generator. For purposes of this disclosure, it is appreciated that a ramp event of the output ramp signal is the time during which the ramp signal decreases continuously. In another example, it is appreciated that the ramp event of the output ramp signal could also be considered as the time during which the ramp signal increases continuously. An output capacitor coupled to the output of the ramp generator is discharged by assist current, which therefore reduces a ramp settling time of the ramp signal that is caused by loading of the output of the ramp generator, which therefore improves the maximum frame rate and image sensor performance in accordance with the teachings of the present invention.

To illustrate, FIG. 1 shows one example of an imaging system 100 including a readout circuit with a current integration ramp generator with a low power ramp settling assist circuit in accordance with the teachings of the present invention. As shown in the illustrated example, imaging system 100 includes a pixel array 102, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in each photodiode is transferred to a floating diffusion included in each pixel circuit 104, which is converted to an image signal and then read out from each pixel circuit 104 by readout circuit 106 through column bitlines 112. In the various examples, readout circuit 106 may read out a row of image data at a time along readout column bitlines 112 (illustrated) or may read out the image data using a variety of other techniques (not illustrated), such as a serial readout or a full parallel readout of all pixel circuits 104 simultaneously.

In various examples, readout circuit 106 may include amplification circuitry, an analog to digital converter (ADC), or otherwise. In the depicted example, ADC 118 includes a comparator circuit 116 coupled to receive the image signals from pixel array 102 through the column bitlines 112. In one example, the comparator circuit 116 may include a plurality of comparators coupled to receive the image signals through the bitlines 112. In the example, each of the comparators included in comparator circuit 116 is also coupled to receive a ramp signal 140 from a ramp generator 114 as shown. In the example, each comparator included in comparator circuit 116 may be used to determine a digital representation of the image signal using a counter based on a comparison of ramp signal 140 to the image signal voltage level received through bitlines 112. As will be discussed in further detail below, in various examples the ramp generator 114 is a current integration ramp generator. In the various examples, the ramp settling time, or delay, of the ramp signal 140 that is generated by the ramp generator 114 and received by the comparator circuit 116 is reduced with a low power settling assist circuit to increase the maximum frame rate and therefore improve the performance of the imaging system 100 in accordance with the teachings of the present invention.

In the example, the digital image data values generated by ADC 118 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 104 is coupled to pixel array 102 to control operation of the plurality of photodiodes in pixel array 102. For example, control circuit 104 may generate a shutter signal for controlling image acquisition. In one example, the shutter signal is a global shutter signal for simultaneously enabling all pixel circuits 104 within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
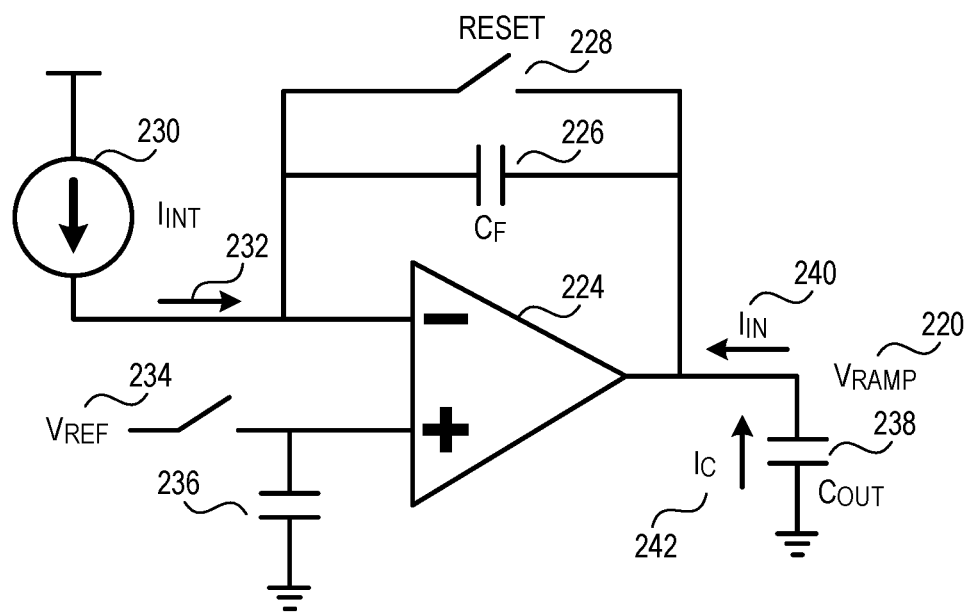
FIG. 2 shows a circuit model of an example of a current integration ramp generator without a low power ramp settling assist circuit.

FIG. 2 shows a schematic of an example of a current integration ramp generator without a low power ramp settling assist circuit. As shown, the current integration ramp generator includes an operational amplifier 224. A first input (e.g., inverting input) of the operational amplifier 224 is coupled to an integration current source 230 to receive an integration current $I_{INT}$ 232. A second input (e.g., non-inverting input) of the operational amplifier 224 is coupled to receive a reference voltage $V_{REF}$ 234. In the depicted example, a switch and a capacitor 236 may be coupled to the non-inverting input of operational amplifier 224 to sample and hold the reference voltage $V_{REF}$ 224 at the non-inverting input of operational amplifier 224. In the depicted example, a feedback capacitor $C_F$ 226 is coupled an output of operational amplifier 224 and the inverting input of operational amplifier 224. A reset switch 228 is also coupled between the output of operational amplifier 224 and the inverting input of operational amplifier 224. The example depicted in FIG. 2 shows that an output capacitor $C_{OUT}$ 238 is coupled between the output of operational amplifier 224 and ground. As will be discussed, the current $I_C$ 242 represents the current that is discharged from the output capacitor $C_{OUT}$ 238 and the current $I_{IN}$ 240 represents the current that is absorbed by the output of the operational amplifier 224 due to the discharge of the output capacitor $C_{OUT}$ 238.

Figure 3:
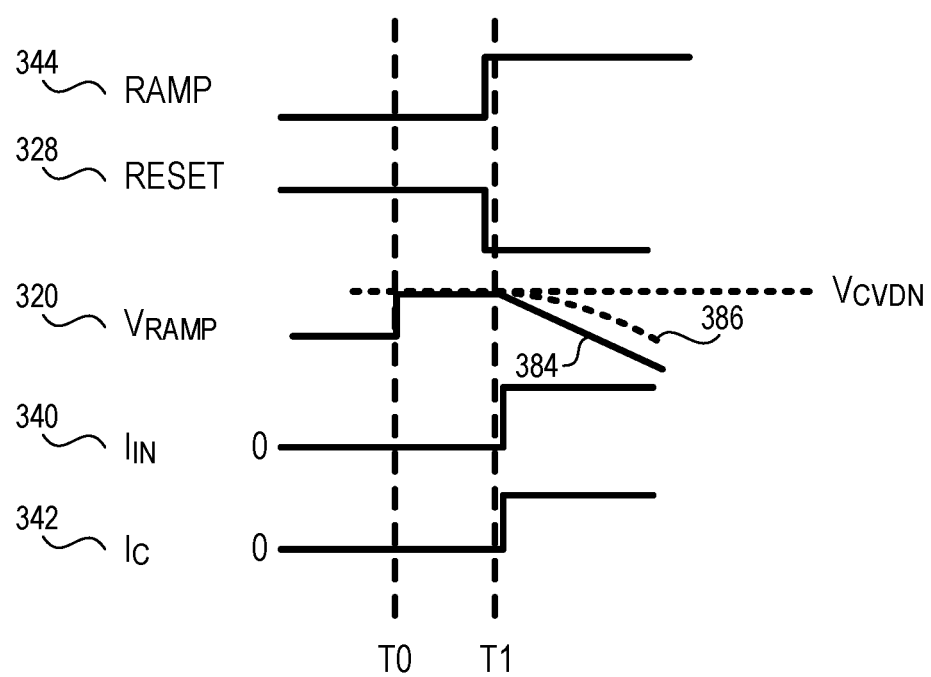
FIG. 3 is a timing diagram that illustrates signals a non-ideal ramp signal generated by an example current integration ramp generator without a low power ramp settling assist circuit compared to an ideal ramp signal.

FIG. 3 is a timing diagram that illustrates signals a non-ideal ramp signal generated by an example current integration ramp generator without a low power ramp settling assist circuit compared to an ideal ramp signal. It is appreciated that the signals illustrated in the timing diagram of FIG. 3 may be examples of signals found in the current integration ramp generator depicted in FIG. 2, and that similarly named and numbered elements described above are coupled and function similarly below. In particular, the depicted example shows a ramp signal RAMP 344, a reset signal RESET 328, a ramp voltage signal $V_{RAMP}$ 320, an input current $I_{IN}$ 340, and a capacitor current $I_C$ 342.

As shown in the example depicted in FIG. 3, the ramp voltage signal $V_{RAMP}$ 320 is initialized at time T0 before a ramp event to a voltage $V_{CVDN}$. At time T1, the ramp event begins, which is shown with the ramp signal RAMP 344 transitioning to a high level (e.g., "1") and the reset signal RESET 328 transitioning to a low level (e.g., "0"). In the example, the reset signal RESET 328 transitioning to the low level (e.g., "0") turns off the reset switch 228 shown in the example depicted in FIG. 2. As such a ramp event begins in the ramp voltage signal $V_{RAMP}$ 320 at time T1 with the voltage ramping down as shown. Ideally, the ramp voltage signal $V_{RAMP}$ 320 should have a sharp corner at time T1 and begin ramping down linearly as indicated with ideal ramp signal 384. However, of a current integration ramp generator without a low power ramp settling assist circuit in accordance with the teachings of the present invention has a non-ideal ramp signal 386 as shown due to discharging of the output capacitor $C_{OUT}$ 238.

In particular, at time T1 when the ramp event or ramp phase starts in ramp voltage signal $V_{RAMP}$ 320, the integration current $I_{INT}$ 232 goes through the feedback capacitor $C_F$ 226 and the ramp voltage signal $V_{RAMP}$ 320 starts to ramp down. At this time, the output capacitor $C_{OUT}$ 238 needs to discharge. As a consequence, the output of the operational amplifier 224 needs to adjust the ramp voltage signal $V_{RAMP}$ 320 to absorb the input current $I_{IN}$ 340, which corresponds to the discharge current $I_C$ 342 of the output capacitor $C_{OUT}$ 238. In particular, due to the limited bandwidth of the operational amplifier 224, the ramp voltage signal $V_{RAMP}$ 320 and the input current $I_{IN}$ 340 resettle according to the equations:

$$V_{RAMP}(t) = V_{CVDN} - \frac{I_{INT}t}{C_F} + \frac{I_{INT}C_{OUT}}{C_F g_m}\left(1 - e^{\frac{g_m t}{C_{OUT}}}\right), \quad (1)$$

$$I_N(t) = I_C(t) = \frac{I_{INT}C_{OUT}}{C_F}\left(1 - e^{\frac{g_m t}{C_{OUT}}}\right), \quad (2)$$

where $g_m$ is the effective transconductance of the operational amplifier 224.

Figure 4:
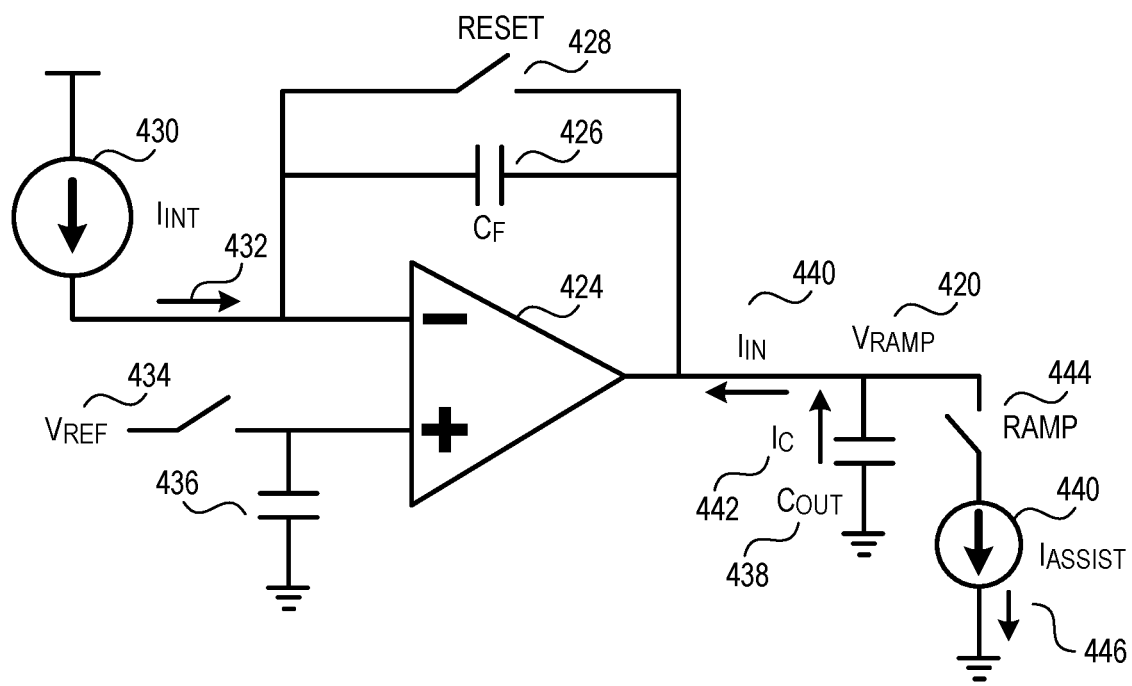
FIG. 4 shows one example of a schematic of a current integration ramp generator with a low power ramp settling assist circuit in accordance with the teachings of the present invention.

FIG. 4 shows one example of a schematic of a current integration ramp generator with a low power ramp settling assist circuit in accordance with the teachings of the present invention. It is appreciated that the current integration ramp generator with a low power ramp settling assist circuit shown in FIG. 4 may be an example of the ramp generator 114 illustrated in FIG. 1, and that similarly named and numbered elements described above are coupled and function similarly below.

As shown in FIG. 4, the current integration ramp generator includes an operational amplifier 424. A first input (e.g., inverting input) of the operational amplifier 424 is coupled to an integration current source 430 to receive an integration current $I_{INT}$ 432. A second input (e.g., non-inverting input) of the operational amplifier 424 is coupled to receive a reference voltage $V_{REF}$ 434. In the depicted example, a switch and a capacitor 436 may be coupled to the non-inverting input of operational amplifier 424 to sample and hold the reference voltage $V_{REF}$ 424 at the non-inverting input of operational amplifier 424. In the depicted example, a feedback capacitor $C_F$ 426 is coupled an output of operational amplifier 424 and the inverting input of operational amplifier 424. A reset switch 428 is also coupled between the output of operational amplifier 424 and the inverting input of operational amplifier 424. The example depicted in FIG. 4 shows that an output capacitor $C_{OUT}$ 438 is coupled between the output of operational amplifier 424 and ground. As shown in the depicted example, an assist current source 440 is coupled between the output of the operational amplifier 424 and ground. In the example, a ramp switch 444 is coupled to the assist current source 440 such that the ramp switch 444 and the assist current source 440 are coupled between the output of the operational amplifier 424 and ground.

In operation, the assist current source 440 is configured to conduct an assist current $I_{ASSIST}$ 446 from the output of the operational amplifier 424 to ground in response to the reset switch 428 being turned off, which corresponds to a ramp event occurring in the ramp voltage $V_{RAMP}$ 420. In the depicted example, the ramp switch 444 is also turned on during the ramp event occurring in the ramp voltage $V_{RAMP}$ 420 in order to conduct the assist current $I_{ASSIST}$ 446 from the output of the operational amplifier 424 to ground during the ramp event. The current $I_C$ 442 represents the current that is discharged from the output capacitor $C_{OUT}$ 438 and the current $I_{IN}$ 440 represents the current that would be absorbed by the output of the operational amplifier 424 without the assist current source 440 due to the discharge of the output capacitor $C_{OUT}$ 438.

In particular, the assist current $I_{ASSIST}$ 446 is configured to be substantially equal in magnitude to the discharge current $I_C$ 442 of the output capacitor $C_{OUT}$ 438 during the ramp event in the ramp voltage $V_{RAMP}$ 420. Therefore, the input current $I_{IN}$ 440 that would otherwise need to be absorbed by the output of the operational amplifier 424 remains substantially zero and the operational amplifier 424 does not need to resettle in accordance with the teachings of the present invention. As such, the ramp voltage $V_{RAMP}$ 420 is much closer to an ideal ramp signal with substantially no settling time delay and a sharper corner at the beginning of the ramp event in accordance with the teachings of the present invention.

Figure 5:
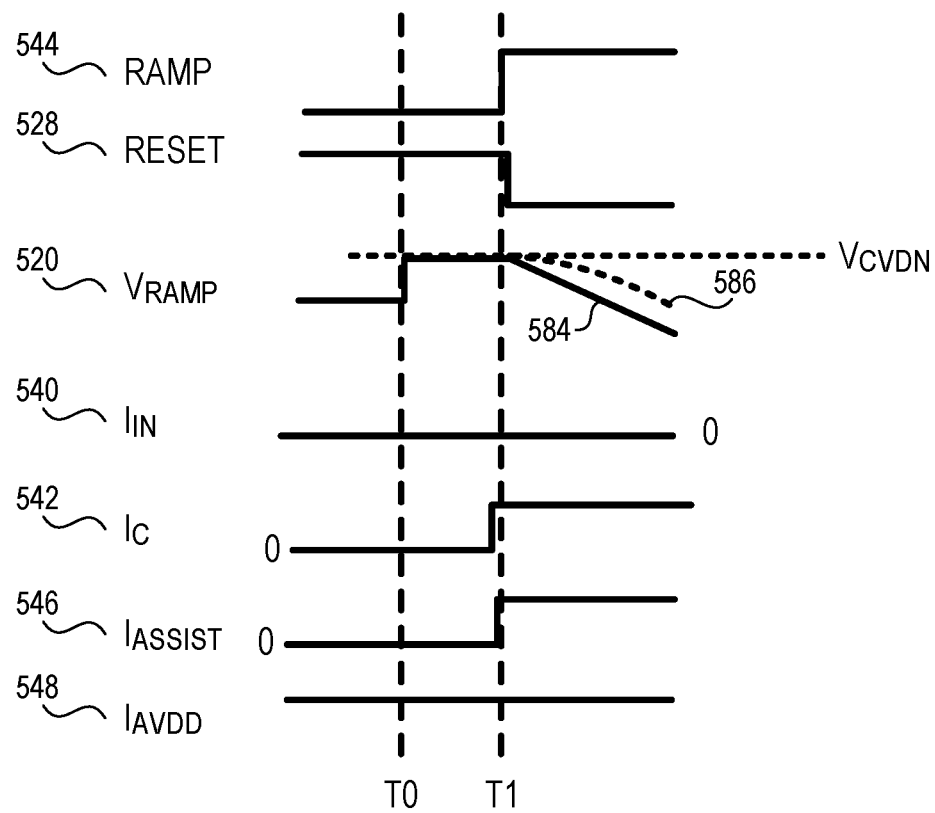
FIG. 5 is a timing diagram that illustrates signals including a ramp signal generated by an example current integration ramp generator with a low power ramp settling assist circuit in accordance with the teachings of the present invention.

FIG. 5 is a timing diagram that illustrates signals including a ramp signal generated by an example current integration ramp generator with a low power ramp settling assist circuit in accordance with the teachings of the present invention. It is appreciated that the signals illustrated in the timing diagram of FIG. 5 may be examples of signals found in the current integration ramp generator depicted in FIG. 4, and that similarly named and numbered elements described above are coupled and function similarly below. In particular, the depicted example shows a ramp signal RAMP 544, a reset signal RESET 528, a ramp voltage signal $V_{RAMP}$ 520, an input current $I_{IN}$ 540, a capacitor current $I_C$ 542, an assist current $I_{ASSIST}$ 546, and a power line current $I_{AVDD}$ 548.

As shown in the example depicted in FIG. 5, the ramp voltage signal $V_{RAMP}$ 520 is initialized at time T0 before a ramp event to a voltage $V_{CVDN}$. At time T1, the ramp event begins, which is shown with the ramp signal RAMP 544 transitioning to a high level (e.g., "1") and the reset signal RESET 528 transitioning to a low level (e.g., "0"). In the example, the ramp signal RAMP 544 transitioning to the high level (e.g., "1") turns on the ramp switch 444 and the reset signal RESET 528 transitioning to the low level (e.g., "0") turns off the reset switch 428 shown in the example depicted in FIG. 4. As such a ramp event begins in the ramp voltage signal $V_{RAMP}$ 520 at time T1 with the voltage ramping down as shown. As will be discussed, with the assist current $I_{ASSIST}$ 546 being configured to be substantially equal to the capacitor current $I_C$ 542 to discharge the output capacitor $C_{OUT}$ 438, the ramp voltage signal $V_{RAMP}$ 520 has a sharp corner at time T1 and begin ramping down linearly with substantially no settling delay as indicated with ideal ramp signal 584. It is appreciated that without the assist current source 440 providing the assist current $I_{ASSIST}$ 546, a non-ideal ramp signal 586 would occur due to discharging of the output capacitor $C_{OUT}$ 438.

In particular, at time T1 when the ramp event or ramp phase starts in ramp voltage signal $V_{RAMP}$ 520, the integration current $I_{INT}$ 532 goes through the feedback capacitor $C_F$ 526 and the ramp voltage signal $V_{RAMP}$ 520 starts to ramp down. At this time, the output capacitor $C_{OUT}$ 438 needs to discharge with capacitor current $I_C$ 542. With the assist current source 440 providing the assist current $I_{ASSIST}$ 4446, which has a magnitude substantially equal to the capacitor current $I_C$ 542, the input current $I_{IN}$ 540 absorbed by the output of the remains substantially zero, which enables the ideal ramp signal 584 at time T1 as shown. Thus, it is appreciated that the assist current $I_{ASSIST}$ 546, the input current $I_{IN}$ 540, and the ramp voltage signal $V_{RAMP}$ 520 at time T1 can be represented according to the equations:

$$I_{ASSIST} = \frac{I_{INT} C_{OUT}}{C_F}, \quad (3)$$

$$I_N(t) = 0, \quad (4)$$

$$V_{RAMP}(t) = V_{CVDN} - \frac{I_{INT} t}{C_F}. \quad (5)$$

In operation, it is further appreciated that with the ramp signal RAMP 544 configured to be off during a non-ramp events (e.g., at time T0) or prior to the ramp event at time T1, extra power consumption due to the assist current 546 is saved with the ramp switch 444 being turned off during non-ramp events (e.g., at time T0). Furthermore, as shown in FIG. 5, it is also appreciated that the power line current $I_{AVDD}$ 548 remains substantially constant or unchanged during non-ramp events (e.g., at time T0) and during ramp events (e.g., at time T1) since the assist current source is coupled between the output of the operational amplifier 424 and ground instead of between the power line (e.g., AVDD) and the output of the operational amplifier 424.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A ramp generator, comprising:
   an operational amplifier having a first input, a second input, and an output to generate a ramp signal;
   an integration current source coupled to the first input of the operational amplifier;
   a reference voltage coupled to the second input of the operational amplifier;
   a feedback capacitor coupled between the first input and the output of the operational amplifier;
   a reset switch coupled between the first input and the output of the operational amplifier, wherein the reset switch is configured to be turned on to reset the ramp generator, wherein a ramp event is configured to be generated in the ramp signal at the output of the operational amplifier in response to the reset switch being turned off; and
   an assist current source coupled between the output of the operational amplifier and ground, wherein the assist current source is configured to conduct an assist current from the output of the operational amplifier to ground in response to the reset switch being turned off, and wherein the feedback capacitor is coupled between the assist current source and the first input of the operational amplifier.

2. The ramp generator of claim 1, further comprising a reference capacitor coupled between the second input of the operational amplifier and ground.

3. The ramp generator of claim 1, further comprising an output capacitor coupled between the output of the operational amplifier and ground.

4. The ramp generator of claim 3, wherein the assist current is substantially equal to an integration current conducted through the integration current source multiplied by a ratio of a capacitance of the output capacitor and a capacitance of the feedback capacitor.

5. The ramp generator of claim 3, wherein the assist current conducted through the assist current source is substantially equal to a discharge current from the output capacitor during the ramp event that is configured to be generated in the ramp signal at the output of the operational amplifier in response to the reset switch being turned off.

6. The ramp generator of claim 1, wherein the assist current is zero when the reset switch is configured to be turned on to reset the ramp generator.

7. The ramp generator of claim 6, further comprising an assist current switch coupled to the assist current source, wherein the assist current switch is configured to be turned off when the reset switch is configured to be turned on, wherein the assist current switch is configured to be turned on when the reset switch is configured to be turned off.

8. The ramp generator of claim 1, wherein the reset switch is coupled between the assist current source and the first input of the operational amplifier.

9. The ramp generator of claim 1, wherein the reset switch and the feedback capacitor are arranged in parallel to one another between the assist current source and the first input of the operation amplifier.

10. The ramp generator of claim 1, wherein the reset switch and the feedback capacitor are arranged in parallel to one another between the integration current source and the assist current source.

11. An imaging system, comprising:
 an array of pixels to receive image light and generate an image charge voltage signal in response; and
 readout circuitry coupled to receive the image charge voltage signal from the array of pixels and provide a digital representation of the image charge voltage signal in response, the readout circuitry including a comparator to receive the image charge voltage signal, compare the image charge voltage signal to a ramp signal from a ramp generator, and provide the digital representation of the image charge voltage signal in response, wherein the ramp generator comprises:
  an operational amplifier having a first input, a second input, and an output to generate the ramp signal;
  an integration current source coupled to the first input of the operational amplifier;
  a reference voltage coupled to the second input of the operational amplifier;
  a feedback capacitor coupled between the first input and the output of the operational amplifier;
  a reset switch coupled between the first input and the output of the operational amplifier, wherein the reset switch is configured to be turned on to reset the ramp generator, wherein a ramp event is configured to be generated in the ramp signal at the output of the operational amplifier in response to the reset switch being turned off; and
  an assist current source coupled between the output of the operational amplifier and ground, wherein the assist current source is configured to conduct an assist current from the output of the operational amplifier to ground in response to the reset switch being turned off, and wherein the feedback capacitor is coupled between the assist current source and the first input of the operational amplifier.

12. The imaging system of claim 11, wherein the ramp generator further comprises a reference capacitor coupled between the second input of the operational amplifier and ground.

13. The imaging system of claim 11, wherein the ramp generator further comprises an output capacitor coupled between the output of the operational amplifier and ground.

14. The imaging system of claim 13, wherein the assist current is substantially equal to an integration current conducted through the integration current source multiplied by a ratio of a capacitance of the output capacitor and a capacitance of the feedback capacitor.

15. The imaging system of claim 13, wherein the assist current conducted through the assist current source is substantially equal to a discharge current from the output capacitor during the ramp event that is configured to be generated in the ramp signal at the output of the operational amplifier in response to the reset switch being turned off.

16. The imaging system of claim 11, wherein the assist current is zero when the reset switch is configured to be turned on to reset the ramp generator.

17. The imaging system of claim 16, wherein the ramp generator further comprises an assist current switch coupled to the assist current source, wherein the assist current switch is configured to be turned off when the reset switch is configured to be turned on, wherein the assist current switch is configured to be turned on when the reset switch is configured to be turned off.

18. The imaging system of claim 11, wherein the reset switch is coupled between the assist current source and the first input of the operational amplifier.

19. The imaging system of claim 11, wherein the reset switch and the feedback capacitor are arranged in parallel to one another between the assist current source and the first input of the operation amplifier.

20. The imaging system of claim 11, wherein the reset switch and the feedback capacitor are arranged in parallel to one another between the integration current source and the assist current source.

* * * * *